United States Patent
Fortin et al.

(10) Patent No.: US 9,831,874 B1
(45) Date of Patent: Nov. 28, 2017

(54) TUNABLE IMPEDANCE CIRCUIT FOR A TRANSMITTER OUTPUT STAGE

(71) Applicant: Cadence Design Systems, Inc., San Jose, CA (US)

(72) Inventors: Guillaume Fortin, Montreal (CA); Stephane Leclerc, Anjou (CA)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 15/276,570

(22) Filed: Sep. 26, 2016

(51) Int. Cl.
*H03K 17/16* (2006.01)
*H03K 19/003* (2006.01)
*H03K 19/00* (2006.01)
*H04B 3/14* (2006.01)

(52) U.S. Cl.
CPC ......... *H03K 19/0005* (2013.01); *H04B 3/145* (2013.01)

(58) Field of Classification Search
CPC .............................. H03K 19/0005; H04B 3/145
USPC .......................................................... 326/30
See application file for complete search history.

(56) References Cited

U.S. PATENT DOCUMENTS

| | | | |
|---|---|---|---|
| 2008/0048714 A1* | 2/2008 | Lee | H03K 19/0005 326/30 |
| 2010/0007375 A1* | 1/2010 | Lee | H04L 25/0298 326/30 |
| 2011/0291698 A1* | 12/2011 | Ko | H03K 19/01758 326/30 |

* cited by examiner

*Primary Examiner* — Daniel D Chang
(74) *Attorney, Agent, or Firm* — Andrews Kurth Kenyon LLP (57) ABSTRACT

A system, a method and circuit arrangements for adjusting an output impedance of an electric circuit involve impedance cells connected to an output terminal in parallel with one another. Each impedance cell includes parallel branches. Each branch includes switching units and resistors. The resistors in a branch are connected in series and contribute to an overall impedance of their corresponding impedance cell. Each switching unit is configurable to selectively bypass a corresponding one of the resistors, thereby calibrating the impedance cell. The output impedance can be set by identifying a combination of calibrated impedance cells that need to be activated in order to produce the target output impedance.

20 Claims, 6 Drawing Sheets

TUNABLE IMPEDANCE CIRCUIT FOR A TRANSMITTER OUTPUT STAGE

FIELD OF THE INVENTION

This description relates to methods and circuits for adjusting output impedance, in particular the output impedance of a transmitter device.

BACKGROUND

The output impedance of a transmitter device is important because the impedance may affect the ability of the transmitter to transmit efficiently, or without error, to a receiver device. For example, it is often desirable to match the output impedance of the transmitter to the input impedance of the receiver in order to maximize power transfer or minimize signal reflections. Thus, transmitters are often designed to meet a target output impedance. In practice, however, the actual output impedance rarely matches the target output impedance exactly. Failure to meet the target output impedance may be attributed to limits on the ability of a manufacturing process to accurately set the impedance of transmitter components such as resistors or transistors. Environmental conditions, such as changes in temperature, also contribute to differences in output impedance.

When one needs to cover a wide range of output impedances, the conventional solutions are unsatisfactory for various reasons including cost of implementation and accuracy. One approach is to place an array of identical resistors in parallel to form branches connected to the output. Each resistor is paired in series with a metal-oxide semiconductor field-effect transistor (MOSFET). Activating a transistor contributes a parallel impedance to the output. The parallel impedance is equal to the sum of the impedance of the transistor and the impedance of its paired resistor. The output impedance can thus be adjusted by changing the number of enabled branches. For example, to increase the output impedance, fewer branches are enabled. Using this approach, the change in output impedance as a function of the number of activated transistors is highly nonlinear. Specifically, the impedance change associated with increasing or decreasing the number of enabled branches is proportional to 1/n, where n is the number of branches required to achieve a target impedance. Therefore, the step size is small at low target impedance values, but very large at high target impedance values.

Another approach uses resistors in series with adjustable MOSFETs. The impedance contributed by the MOSFETs is adjusted by changing the number of MOSFETs that are activated. Resistors are linear elements, MOSFETs are not. To increase the linearity, the relative contribution of the resistors to the output impedance must therefore be increased in comparison to the contribution of the transistors. However, changing the relative contributions in this manner leaves little room for adjusting the output impedance using the transistors, especially when considering the wide range of the MOSFET impedance over process variations. The range of output impedances that can be achieved is therefore limited under this second approach.

DESCRIPTION OF EMBODIMENTS

Figure 1:
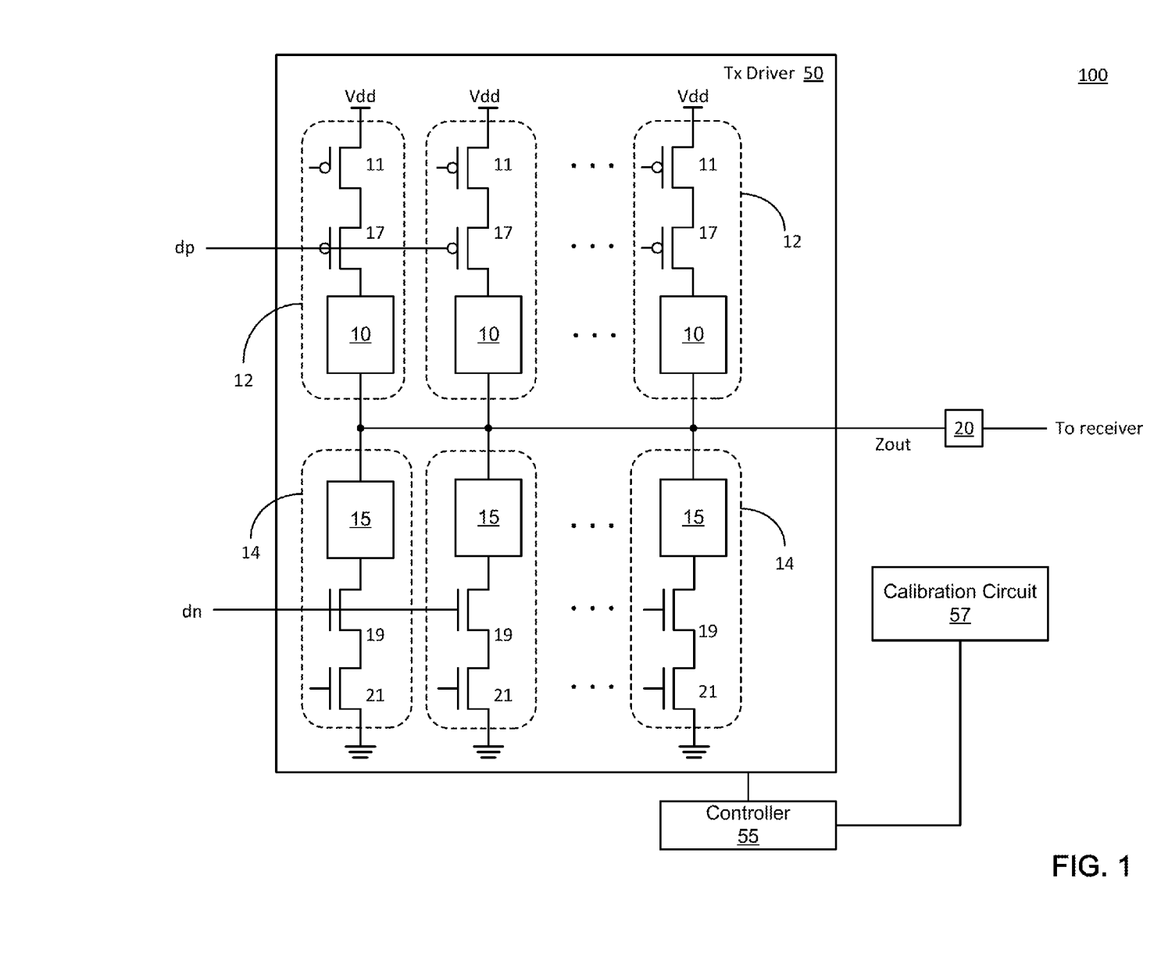
FIG. 1 shows an embodiment of a system for adjusting output impedance.

The present description relates to systems, methods and circuits for adjusting the impedance at an output stage of a transmitter. FIG. 1 shows a system 100 for adjusting output impedance according to an embodiment. The system 100 includes a transmission ("Tx") driver 50, which may be located at an output stage of a transmitter device. For simplicity, the transmitter device and its other components are not shown. The transmitter device sends a data input to the Tx driver 50 for output to a receiver device. The data input may be sent to the Tx driver 50 as a first data signal (dp) and a second data signal (dn). The signals dp and dn may have the same polarity. The Tx driver may amplify the data input through one or more gain stages (not shown), before relaying the data input to an output terminal 20.

Tx driver 50 includes a plurality of tunable impedance cells 12 and 14. The cells are arranged in parallel branches, each branch being connected to the output terminal 20. The impedance at the output terminal 20 (Zout) is determined by how many of the impedance cells 12, 14 are activated, and by how the impedance cells have been individually configured. Details of the impedance cells are described below.

Each impedance cell 12 includes a resistive load 10 in series with a PMOS transistor 11 and a second PMOS transistor 17. Similarly, each impedance cell 14 includes a resistive load 15 in series with an NMOS transistor 19 and a second NMOS transistor 21. The cells 12, 14 are circuit equivalents of specific implementations of impedance cells to be described. For example, each of the resistive loads 10, 15 can, as shown in embodiments discussed below, be implemented with multiple resistors. Similarly, each of the transistors 11, 17, 19 and 21 can be implemented with multiple transistors. Data signal dp is applied as a gate input to each of the PMOS transistors 17. Data signal dn is applied as a gate input to each of the NMOS transistors 19. The impedance cells 12 are connected via the PMOS transistors 11 to a rail voltage (Vdd). Similarly, the impedance cells 14 are connected via the NMOS transistors 21 to ground. The MOSFETs 17, 19 are referred to herein as data transistors because they operate as switches to convey a representation of the data input to the output terminal 20. The transistors 11 and 21 are controlled by enable signals, which are described below in connection with FIG. 4. If a particular data transistor 17, 19 is turned on by the data signal applied to the gate of that transistor, and the corresponding enable transistor 11 or 21 is also turned on, the corresponding impedance cell is activated, forming a current path from Vdd or ground to the output terminal 20.

In addition to Tx driver 50, the system 100 includes a controller 55 and a calibration circuit 57. As it is often difficult to calibrate cells within an active transmitter, the calibration circuit 57 may be connected to a replica of the Tx driver 50. The replica (not shown) is connected to a known impedance (e.g., an external resistor) to calibrate the output impedance. The resulting calibration settings are then stored and later applied to the Tx driver 50. The pull-up and pull-down paths may be calibrated independently, resulting in different calibration codes being stored for the pull-up path versus the pull-down path. For instance, the calibration circuit 57 may calibrate the pull-up path first, then calibrate the pull-down path. For this purpose, separate replica circuits may be provided for the pull-up path and the pull-down path.

During a calibration procedure, at least one cell 12, 14 of the replica circuit is activated such that it contributes to the output impedance of the replica circuit. The reference impedance is equal to the target impedance of an individual cell or group of cells. The calibration circuit 57 measures the impedance based on the voltage or current across the reference impedance. The measurement indicates whether the output impedance is equal to the reference impedance. For example, if the reference impedance is connected in series with the replica circuit (with the other end of the reference impedance being connected to ground when calibrating the pull-up path, or connected to Vdd when calibrating the pull-down path), a voltage divider is formed such that the voltage across the reference impedance will be half of the supply voltage (Vdd/2) when the impedance of the pull-up or pull-down path is equal to the reference impedance. The measurement will therefore indicate whether the impedance of the activated cell needs to be increased or decreased in order to match the reference impedance.

Although the calibration procedure could be used to set the overall output impedance of the Tx driver 50 to a target output impedance equal to the reference impedance, the ability to calibrate to different target output impedances is limited, for example, by the availability of reference impedances. Therefore, the calibration procedure may not be suitable for operating environments where the Tx driver needs to be set to any of multiple output impedance values. As will be explained, this limitation is overcome by first calibrating each impedance cell to the reference impedance (e.g., 600 ohms), then identifying exactly how many calibrated impedance cells need to be activated in order to achieve the target output impedance.

The controller 55 is configured to calibrate the impedance cells 12, 14 based on the measurements obtained by the calibration circuit 57. The controller 55 may receive the measurements directly from the calibration circuit 57, e.g., as a digital value, and then decide how to proceed with the calibration based on the value. Alternatively, the calibration circuit 57 may instruct the controller 55 to increase or decrease the impedance of a particular cell by a specific amount. Therefore, control logic that determines how each cell should be calibrated can be suitably located in either the calibration circuit 57 or the controller 55. Such control logic may include, for example, a digital decoder hard-wired or programmed to provide the configuration of the individual impedance cell required to set the individual cell equal to the reference impedance. Additionally, the digital decoder may implement a table that maps a target output impedance value to a specific combination of calibrated cells that need to be activated in order to generate the target output impedance.

Figure 2:
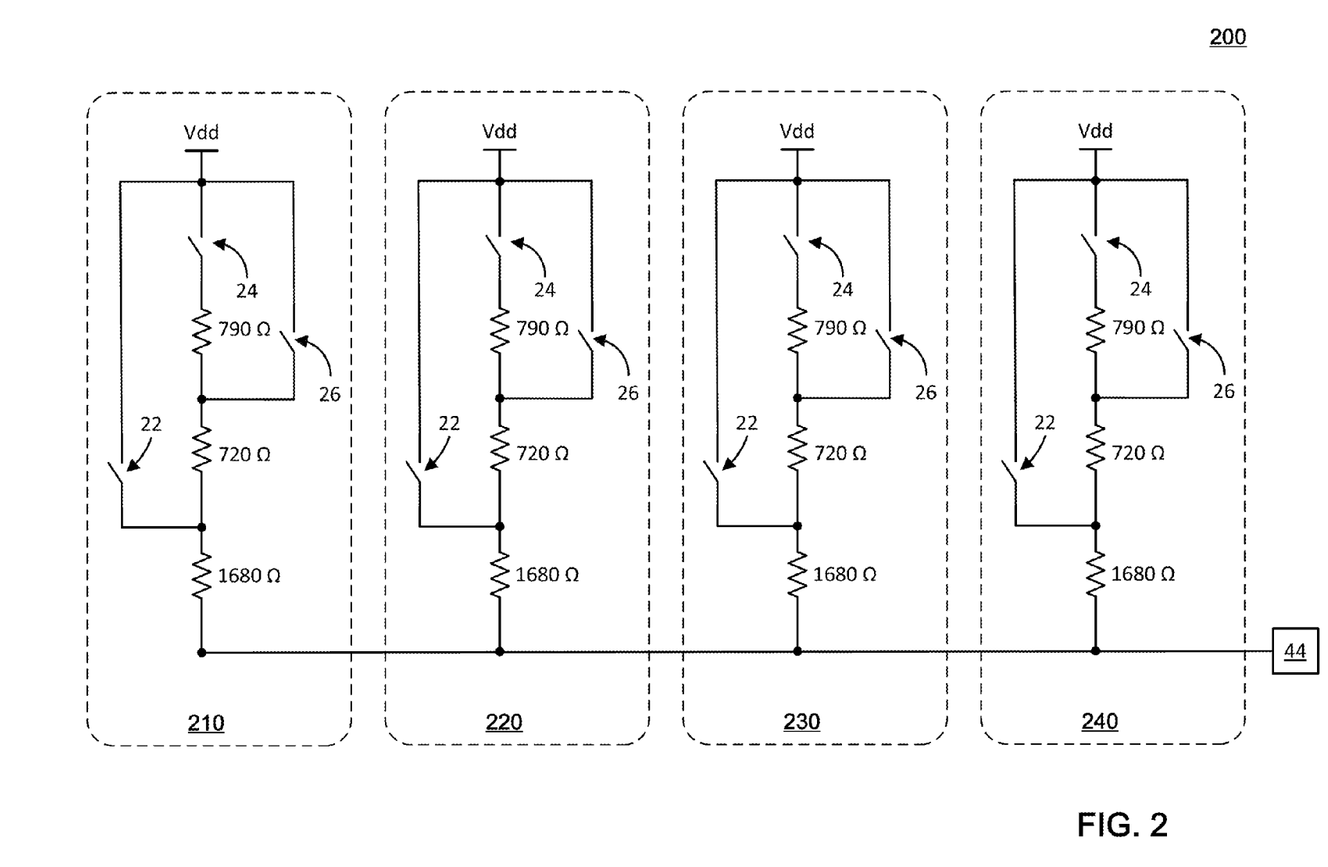
FIG. 2 is a schematic illustrating operating principles of an impedance cell according to an embodiment.

FIG. 2 shows an impedance cell 200 according to an embodiment. The cell 200 includes switching units, referred to herein as bypass units ("BPUs"). BPUs 22, 24 and 26 are symbolically depicted as individual switches, although as will be explained, each BPU can be implemented as a combination of transistors. The cell 200 further includes a plurality of parallel branches 210, 220, 230 and 240. Each branch includes a set of explicit resistors. In the embodiment of FIG. 2, the same set of resistors is used in every branch, and comprises a 790 ohm resistor in series with a 720 ohm resistor and a 1,680 ohm resistor. These are nominal resistance values that will vary due to fabrication uncertainties.

Cell 200 illustrates operating principles of an impedance cell 12 in FIG. 1. Each branch is connected between Vdd and an output terminal 44. The impedance of cell 200 can be tuned by changing the switching states of BPUs 22, 24 and 26. All branches include the same BPUs, although in some applications, one or more branches may be set to a fixed impedance.

The switching states of the BPUs may be controlled such that the parallel combination of all the branches produces a total impedance equal to the target impedance for the cell 200, i.e., the reference impedance. For instance, if the target impedance is 540 ohms, branches 210, 220 and 240 may be set to 2,400 ohms while branch 230 is set to 1,680 ohms, so that the total impedance is 1/(1/1,680+3/2,400). To set the impedance of branch 230 to 1,680 ohms, BPU 22 is closed and BPUs 24 and 26 are open so that the 790 ohm and 720 ohm resistors are bypassed. To set branches 210, 220 and 240 to 2,400 ohms, BPU 26 is closed while leaving BPUs 22 and 24 open, therein bypassing only the 790 ohm resistor. Thus, BPU 24 may be referred to as a "no bypass unit" or "NBPU", BPU 26 as a "single bypass unit" or "SBPU", and BPU 22 as a "double bypass unit" or "DBPU".

Figure 3:
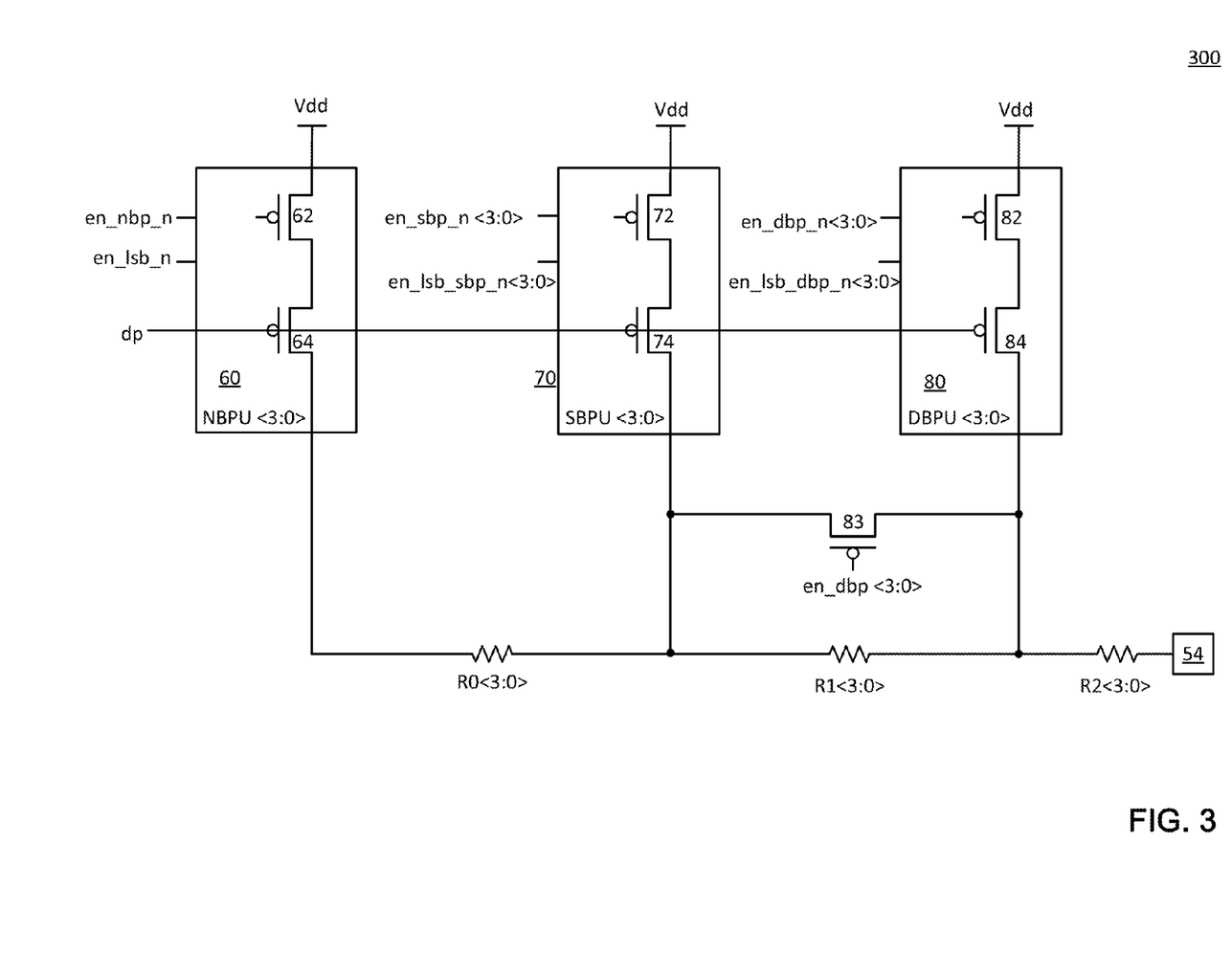
FIG. 3 shows an embodiment of an impedance cell implemented using MOSFETs.

FIG. 3 shows an impedance cell 300 according to an embodiment. The cell 300 is implemented using MOSFETs, specifically PMOS transistors, and may represent the impedance cell 12 in FIG. 1. Unlike in the cell 200, the bypass units in cell 300 are not ideal switches with zero impedance. Because of the non-zero impedance of the bypass units, the impedance of the bypassed resistors influences the output impedance to a small degree and this is taken into consideration when calibrating the output impedance. A similar MOSFET arrangement including NMOS transistors may represent the impedance cell 14 in FIG. 1, but has been omitted from this discussion as the structure would be the same except for the use of NMOS transistors instead of PMOS, and a connection to ground instead of Vdd. The cell 300 includes data transistors 64, 74 and 84, which convey a representation of a data signal "dp" to an output terminal 54. Resistors R0, R1 and R2 are analogous to the resistors in FIG. 2 in that they have fixed impedance values and can be bypassed based on the switching states of BPUs 60, 70 and 80. In this embodiment, R0, R1 and R2 each represent four instances of a resistor, i.e., there are four instances of R0 in parallel, four instances of R1 in parallel, and four instances of R2 in parallel. Thus, each resistor is depicted with a bus label <3:0>. Correspondingly, each BPU represents four individual BPUs and is also bus-labeled, e.g., NBPU<3:0>. Therefore, each of the transistors in the BPUs 60, 70 and 80 represents an array of four transistors in parallel.

NBPU 60 includes, for each instance of resistor R0, a PMOS transistor 62 in series with a PMOS data transistor 64. The gate of PMOS 62 receives a control signal "en_nbp_n" that determines, in conjunction with the data signal dp, whether a path is formed from Vdd to terminal 54 through the resistor R0. All PMOS 62 are controlled simultaneously by the same en_nbp_n signal.

SBPU 70 includes, for each instance of resistor R0, a PMOS transistor 72 in series with a PMOS data transistor 74. The PMOS 72 are individually controlled, with their gates receiving one bit of the control signal "en_sbp_n<3:0>" to determine, in conjunction with the data signal dp, the bypass state of R0<3:0>. In other words, the value of the 4-bit control signal en_sbp_n controls which ones of the four instances of resistor R0 are bypassed, if any.

DBPU 80 includes, for each instance of resistor R1, a PMOS transistor 82 in series with a PMOS data transistor 84. The PMOS 82 are individually controlled, with their gates receiving one bit of the control signal "en_dbp_n<3:0>" to determine, in conjunction with the data signal dp, the bypass state of R1<3:0>.

In addition to controlling DBPU 80, en_dbp_n<3:0> controls four instances of PMOS transistor 83. Together with DBPU 80, the transistor 83 executes the double bypassing of resistors R0 and R1. Transistor 83 shorts resistor R1.

In addition to the above mentioned enable signals, each BPU may receive an additional enable signal (en_lsb_n, en_lsb_sbp_n<3:0>, or en_lsb_dbp_n<3:0>), the purpose of which is to control an additional transistor for fine-tuning the impedance of the individual BPUs. This additional transistor is shown in FIG. 4.

There are other possible implementations that use different connections for transistor 83, additional transistors, or do not use transistor 83 at all. For example, in an alternate embodiment, transistor 83 could be connected to the output of BPU 60 instead of BPU 70. In another embodiment, an additional transistor could be connected between the outputs of BPUs 60 and 80. In yet another embodiment, transistor 83 could be omitted without significant loss of functionality since the main purpose of transistor 83 is to permit a reduction in the size of transistors 82 and 84 in the DBPU 80—and thus the overall area and power—at the expense of slightly reduced edge rates.

Figure 4:
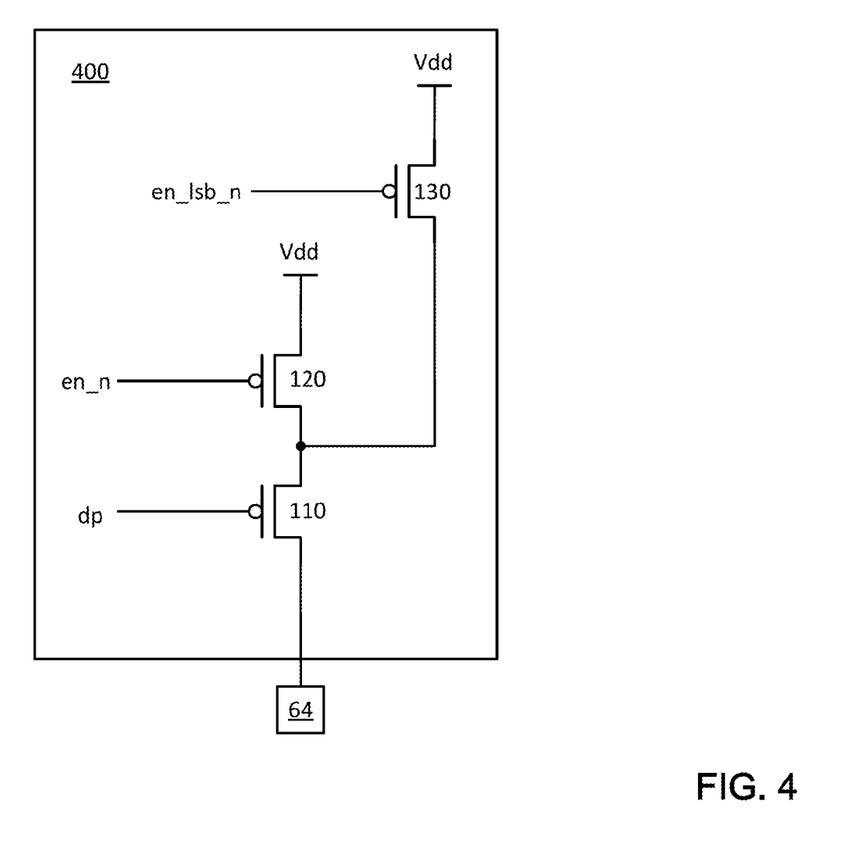
FIG. 4 shows an embodiment of a switch circuit for an impedance cell.

FIG. 4 shows an example switch circuit 400 for an impedance cell. The circuit 400 may represent any of the PMOS BPUs 60, 70 and 80 in FIG. 3. A similar switch circuit exists for any of the NMOS BPUs in the NMOS counterpart of cell 300. The NMOS switch circuit is omitted from this discussion for the same reason as the NMOS counterpart of cell 300. Circuit 400 includes a PMOS data transistor 110 receiving data signal dp at its gate and configured to convey a representation of the data signal dp to an output terminal 64 (e.g., a current proportional to the inverse of the data signal dp). Transistor 110 is in series with the parallel combination of PMOS transistors 120 and 130. However, in an alternative embodiment, there may only be a single transistor (e.g., PMOS transistor 120) or additional transistors in parallel or in series-parallel combinations. PMOS transistors 120 and 130 are respectively controlled by signals "en_n" and "en_lsb_n". These control signals are analogous to the enable signals in FIG. 3 (e.g., en_sbp_n and en_lsb_sbp_n). The extra PMOS transistor 130 provides another way to fine-tune the impedance of the cell 300 by switching on transistor 120 only, transistor 130 only, or both transistors 120 and 130.

The same basic structure in FIG. 4 may be used for each bypass unit, although there may be differences between the relative sizes of the transistors, both intra-unit and inter-unit. For example, in the NBPU, the relative sizes of the transistors 110, 120 and 130 may be 4:8:8. In the DBPU, the relative sizes may be 1:1:3. The sizes of the transistors in the bypass units may be experimentally determined by calculating the cell impedance for different combinations of ratios, to identify combinations that provide for improved linearity (more uniform steps) compared to using transistors of equal size. Therefore, the dimensions of transistors 110, 120 and 130 may be different for each case (NBPU, SBPU and DBPU), and the relative sizes given above should be taken as a non-limiting example.

Figure 5:
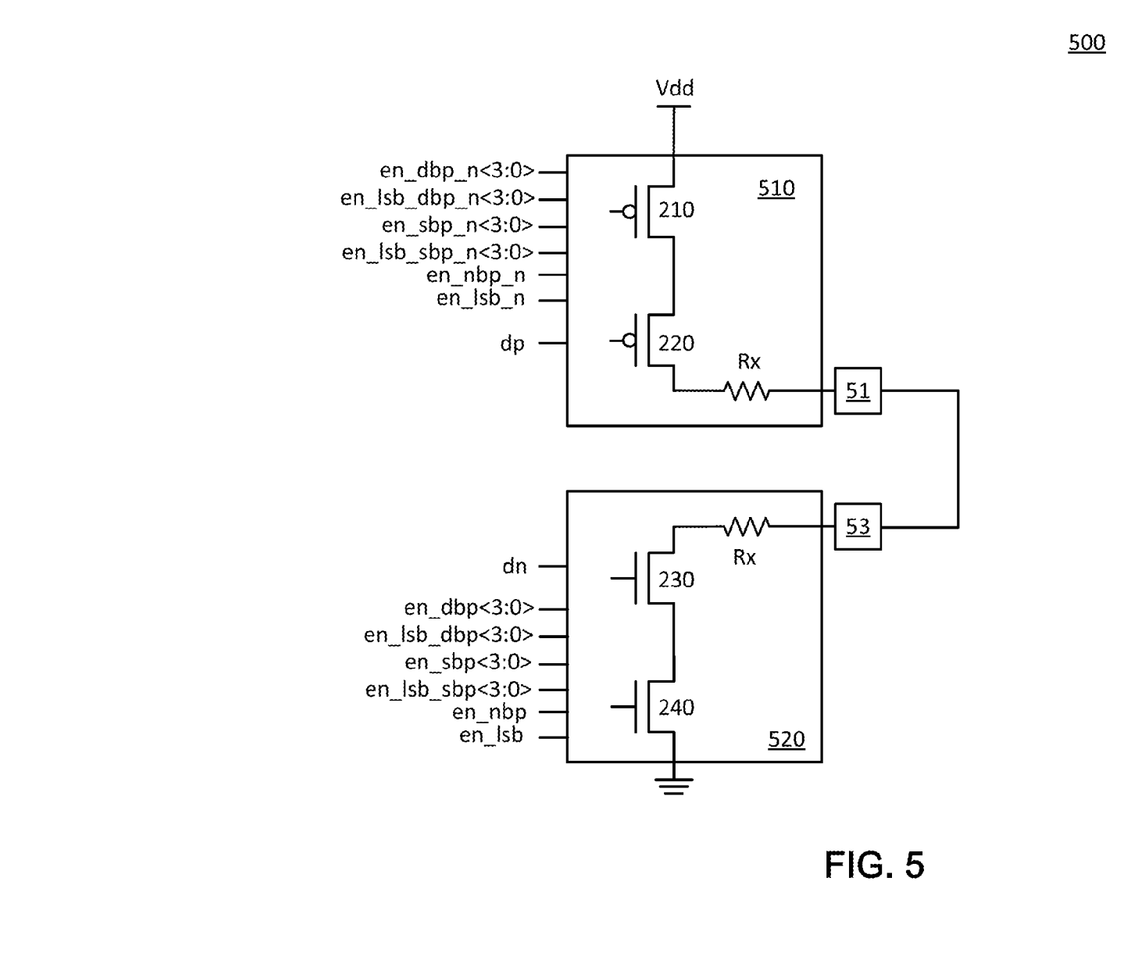
FIG. 5 is a block diagram of an example impedance cell circuit.

FIG. 5 is a block diagram of an impedance cell circuit 500 formed by combining the PMOS and NMOS type cells described earlier. A PMOS cell 510 may represent the impedance cell 12 in FIG. 1, while an NMOS cell 520 may represent the impedance cell 14. The cells 510 and 520 are connected at their respective output terminals 51 and 53, much like how cells 12 and 14 are connected at a shared node to the output terminal 20. Each cell 510, 520 is depicted with a resistor Rx. This resistor represents the total impedance of the selected resistors in the cell. For instance, if none of the resistors in FIG. 3 have been bypassed, Rx is equal to R0+R1+R2+ the impedance of the NBPU cell 60.

The left side of FIG. 5 shows input signals to the cells 510, 520. Cell 510 includes data signal dp, no-bypass control signals "en_nbp_n" and "en_lsb_n", single bypass control signals "en_sbp_n<3:0>" and "en_lsb_sbp_n<3:0>", and double bypass control signals "en_dbp_n<3:0>" and "en_lsb_dbp_n<3:0>". Similarly, cell 520 includes data signal dn, no-bypass control signals "en_nbp" and "en_lsb", single bypass control signals "en_sbp<3:0>" and "en_lsb_sbp<3:0>", and double bypass control signals "en_dbp<3:0>" and "en_lsb_dbp<3:0>". The calibration for cell 510 may be performed independent of the calibration for cell 520, as a separate calibration may be needed for pull-up devices versus pull-down devices. Therefore, the control signals for cell 520 can be set independent of the control signals for cell 510.

Figure 6:
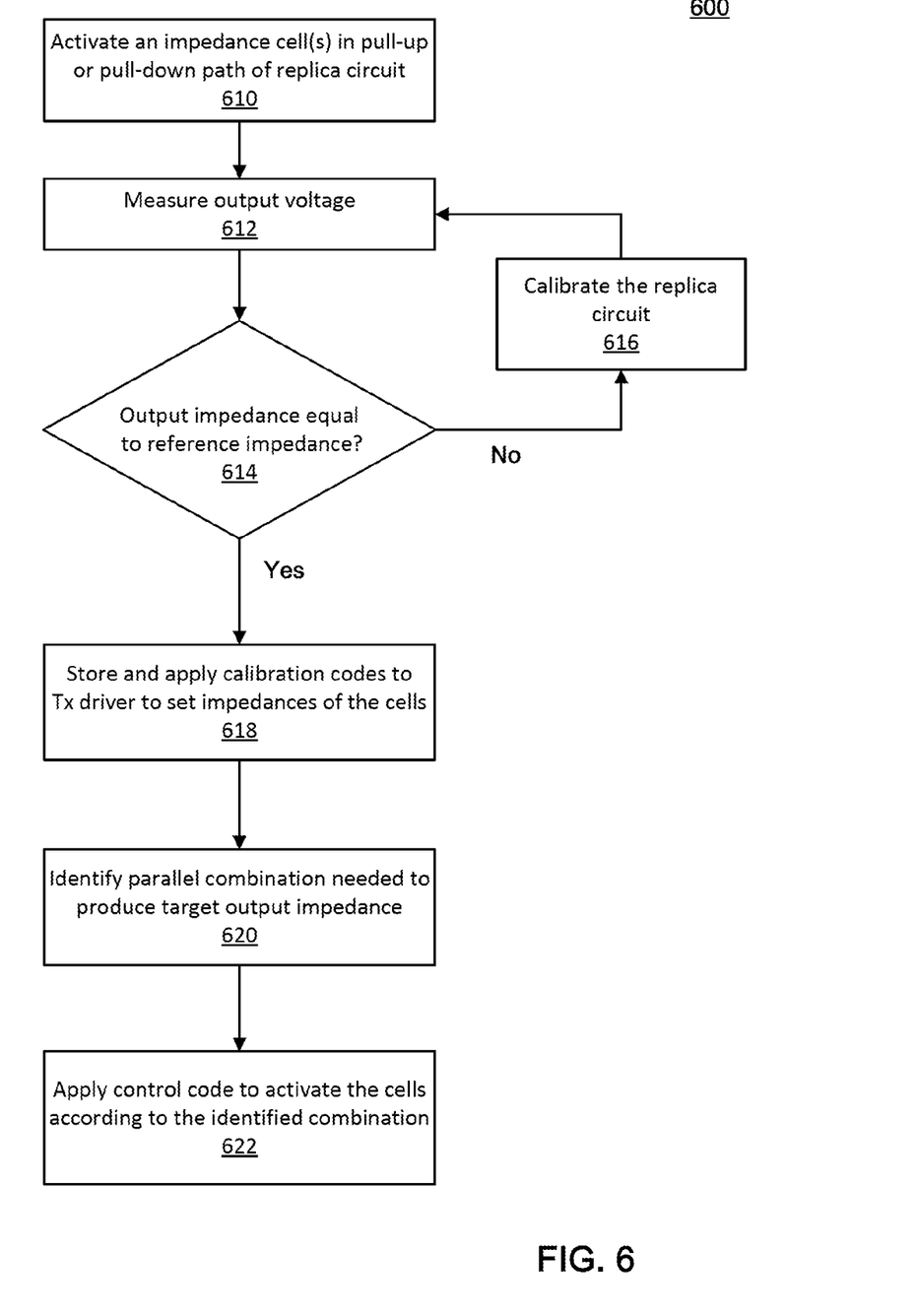
FIG. 6 shows an embodiment of a method for adjusting output impedance.

FIG. 6 shows an embodiment of a method 600 for adjusting output impedance. The method 600 may be performed using the earlier described system and impedance cell embodiments. At step 610, at least one impedance cell in a pull-up or pull-down path of a replica circuit is activated by sending a control signal from the controller 55 to the cells being activated, together with a test data input (e.g., a logical "1" or "0").

At step 612, the output voltage (or current) is measured, for example, using the technique described earlier in connection with the calibration circuit 57, in which a reference impedance is temporarily connected to the replica circuit.

At step 614, the calibration circuit determines, based on the measurement in step 612, whether the output impedance is equal to the reference impedance. If the output impedance is not equal to the reference impedance, the method proceeds to step 616.

At step 616, the cell is calibrated by adjusting the switching states of its transistors. As explained earlier, this may involve bypassing one or more resistors. It may also involve fine-tuning the cell as discussed in connection with the embodiment of FIG. 4. The method then returns to step 612, where the output impedance is measured again.

If the output impedance is equal to the reference impedance (or if the difference is below a specified threshold), then the cell is considered calibrated and the method proceeds to step 618. The switching states of the cell may be stored, e.g., as calibration codes in a memory of the calibration circuit 57, for later use during operation of the Tx driver.

At step 618, the calibration codes are stored and then applied to the Tx driver.

At step 620, the controller identifies the parallel combination of cells needed to produce the target output impedance. For instance, knowing that every cell has been calibrated (e.g., to 600 ohms), the controller may calculate or look up how many 600 ohm cells in parallel would be needed to yield the target output impedance.

At step 622, the controller applies a control code to activate the cells according to the identified combination. The output impedance having been set to the target output impedance, the Tx driver is now ready to transmit data to the receiver.

The description of the foregoing embodiments may refer to algorithms, sequences, macros, and operations that require processor execution of instructions stored in memory. One or more processors may collectively or individually execute a computer program stored in memory. Memory may include a non-transitory computer readable storage medium, which is not limited to, but may include, any type of disk, including floppy disks, optical disks, CD-ROMs, magnetic-optical disks, and other memory such as read-only memory (ROMs), random access memory (RAMs), electrically erasable programmable read-only memory (EEPROM), flash memory, and yet other storage such as magnetic or optical cards, or any type of media that stores program instructions. Each of the memory devices may be further connected to a system bus or a network connection, wired or unwired, capable of facilitating or driving communications.

In the foregoing Description of Embodiments, various features may be grouped together in a single embodiment for purposes of streamlining the disclosure. This method of disclosure is not to be interpreted as reflecting an intention that the claims require more features than are expressly recited in each claim. Rather, as the following claims reflect, inventive aspects lie in less than all features of a single foregoing disclosed embodiment. Thus, the following claims are hereby incorporated into this Description of the Embodiments, with each claim standing on its own as a separate embodiment of the invention.

Moreover, it will be apparent to those skilled in the art from consideration of the specification and practice of the present disclosure that various modifications and variations can be made to the disclosed systems and methods without departing from the scope of the disclosure, as claimed. For instance, steps illustrated in the flowchart(s) may be omitted and/or certain step sequences may be altered, and, in certain instances multiple illustrated steps may be simultaneously performed. Thus, it is intended that the specification and examples be considered as exemplary only, with a true scope of the present disclosure being indicated by the following claims and their equivalents.

What is claimed is:

1. A method for adjusting an output impedance of an electric circuit, the method comprising:
    in a circuit including a plurality of impedance cells in parallel with one another, each impedance cell including parallel branches, and each branch including switching units in addition to resistors connected in series with each other, calibrating each impedance cell by performing at least one of:
        activating a first switching unit in an individual branch of the impedance cell to bypass one of the resistors connected in series with each other; and
        deactivating a second switching unit in the individual branch of the impedance cell so that a resistor associated with the second switching unit is not bypassed.

2. The method of claim 1, further comprising:
    after calibrating the impedances of the impedance cells, identifying a combination of impedance cells that need to be activated in order to produce a target output impedance at an output terminal of the circuit; and
    activating the combination of impedance cells.

3. The method of claim 2, wherein the combination of impedance cells is identified by referencing a mapping table.

4. The method of claim 1, wherein the switching units in the individual branch form a series path through any resistors in the individual branch that have not been bypassed.

5. The method of claim 1, wherein each switching unit includes a plurality of MOSFETs connected in series, and wherein one of the MOSFETs is a data transistor configured to convey a representation of a data input towards an output terminal of the circuit.

6. The method of claim 5, wherein each switching unit includes a parallel combination of MOSFETs, and wherein the parallel combination is in series with the data transistor.

7. The method of claim 5, wherein data transistors in each of the switching units are controlled by the data input.

8. The method of claim 1, wherein the individual branch includes at least three resistors, and wherein each of the at least three resistors has a corresponding switching unit.

9. A system for adjusting an output impedance of a transmitter device, the system comprising:
    a transmitter driver circuit including an input terminal configured to receive a data input and an output terminal configured to transmit a representation of the data input; and
    a plurality of impedance cells, wherein:
        the impedance cells are connected to the output terminal in parallel with one another;
        each impedance cell includes parallel branches;
        each branch includes switching units and resistors;
        the resistors in an individual branch are connected in series with each other and contribute to an overall impedance of their corresponding impedance cell; and
        each switching unit is configurable to selectively bypass a corresponding one of the resistors connected in series with each other.

10. The system of claim 9, wherein the switching units in the individual branch form a series path through any resistors in the individual branch that have not been bypassed.

11. The system of claim 9, wherein each switching unit includes a plurality of MOSFETs connected in series, and wherein one of the MOSFETs is a data transistor configured to convey the representation of the data input towards the output terminal.

12. The system of claim 9, further comprising:
    a control circuit configured to:
        after calibrating the impedances of the impedance cells, identify a combination of impedance cells that need to be activated in order to produce a target output impedance at the output terminal; and
        activate the combination of impedance cells.

13. An adjustable impedance circuit, comprising:
    an input terminal receiving a data input;
    an output terminal transmitting a representation of the data input; and
    a plurality of impedance cells connected to the output terminal in parallel with one another, wherein:
        each impedance cell includes parallel branches;
        each branch includes switching units and resistors;
        the resistors in an individual branch are connected in series with each other and contribute to an overall impedance of their corresponding impedance cell; and
        each switching unit is configurable to selectively bypass a corresponding one of the resistors connected in series with each other.

14. The impedance circuit of claim 13, wherein a specific combination of the impedance cells is activated based on a control signal, thereby producing a target output impedance at the output terminal.

15. The impedance circuit of claim 13, wherein each branch includes at least one of:

a first switching unit activated to bypass a corresponding first resistor; and a second switching unit deactivated to prevent bypassing of a corresponding second resistor.

16. The impedance circuit of claim 13, wherein the switching units in the individual branch form a series path through any resistors in the individual branch that have not been bypassed.

17. The impedance circuit of claim 13, wherein each switching unit includes a plurality of MOSFETs connected in series, and wherein one of the MOSFETs is a data transistor configured to convey the representation of the data input towards the output terminal.

18. The impedance circuit of claim 17, wherein each switching unit includes a parallel combination of MOSFETs, and wherein the parallel combination is in series with the data transistor.

19. The impedance circuit of claim 17, wherein data transistors in each of the switching units are controlled by the data input.

20. The impedance circuit of claim 13, wherein the individual branch includes at least three resistors, and wherein each of the at least three resistors has a corresponding switching unit.

* * * * *